US 9,276,146 B2

(12) United States Patent
Herrmann et al.

(10) Patent No.: US 9,276,146 B2
(45) Date of Patent: Mar. 1, 2016

(54) INFRARED SENSOR DEVICE AND METHOD FOR PRODUCING AN INFRARED SENSOR DEVICE

(71) Applicant: Robert Bosch GmbH, Stuttgart (DE)

(72) Inventors: Ingo Herrmann, Friolzheim (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/400,691

(22) PCT Filed: Apr. 12, 2013

(86) PCT No.: PCT/EP2013/057693
§ 371 (c)(1),
(2) Date: Nov. 12, 2014

(87) PCT Pub. No.: WO2013/171010
PCT Pub. Date: Nov. 21, 2013

(65) Prior Publication Data
US 2015/0102443 A1   Apr. 16, 2015

(30) Foreign Application Priority Data

May 16, 2012   (DE) .......................... 10 2012 208 192

(51) Int. Cl.
*H01L 31/0352*   (2006.01)
*G01J 5/20*   (2006.01)
(Continued)

(52) U.S. Cl.
CPC ......... *H01L 31/035281* (2013.01); *G01J 5/023* (2013.01); *G01J 5/024* (2013.01); *G01J 5/0225* (2013.01); *G01J 5/046* (2013.01);
(Continued)

(58) Field of Classification Search
CPC ................. H01L 31/035281; H01L 31/02005; H01L 31/028; H01L 27/1443; H01L 31/1804; H01L 27/14659; H01L 31/103; G01J 5/20; G01J 5/046
USPC .............. 257/53, 432, 446, 510, 429, E27.13; 438/57, 48, 411
See application file for complete search history.

(56) References Cited

U.S. PATENT DOCUMENTS 6,573,504 B2 *   6/2003   Iida et al. ................... 250/338.4
2001/0028035 A1   10/2001   Iida et al.
(Continued)

FOREIGN PATENT DOCUMENTS

DE         692 16 862 T2     6/1997
DE    10 2006 028 435 A1   12/2007
(Continued)

OTHER PUBLICATIONS

International Search Report corresponding to PCT Application No. PCT/EP2013/057693, mailed Aug. 21, 2014 (German and English language document) (8 pages).

*Primary Examiner* — Thinh T Nguyen
(74) *Attorney, Agent, or Firm* — Maginot, Moore & Beck LLP

(57) ABSTRACT

An infrared sensor device includes at least one sensor element formed in a semiconductor substrate, an SOI wafer that defines a gap below and around the sensor element, and a suspension device that is configured to suspend the sensor element in the SOI wafer. The sensor element is substantially arranged below the suspension device, thereby achieving a high sensitivity, low thermal capacity, low thermal coupling to the substrate and a high image refresh rate.

16 Claims, 4 Drawing Sheets

(51) Int. Cl.
    *H01L 27/146*     (2006.01)
    *H01L 31/103*     (2006.01)
    *G01J 5/04*     (2006.01)
    *G01J 5/02*     (2006.01)
    *H01L 27/144*     (2006.01)
    *H01L 31/02*     (2006.01)
    *H01L 31/028*     (2006.01)
    *H01L 31/18*     (2006.01)

(52) U.S. Cl.
    CPC .............. *G01J 5/20* (2013.01); *H01L 27/1443* (2013.01); *H01L 27/14649* (2013.01); *H01L 31/02005* (2013.01); *H01L 31/028* (2013.01); *H01L 31/103* (2013.01); *H01L 31/1804* (2013.01); *Y02E 10/50* (2013.01)

(56) References Cited

U.S. PATENT DOCUMENTS

| | | | |
|---|---|---|---|
| 2005/0224714 A1* | 10/2005 | Akin et al. | 250/332 |
| 2007/0152265 A1 | 7/2007 | Moriyama et al. | |
| 2007/0267578 A1* | 11/2007 | Seitz et al. | 250/395 |
| 2013/0142215 A1* | 6/2013 | Nemirovsky et al. | 374/121 |

FOREIGN PATENT DOCUMENTS

| | | |
|---|---|---|
| DE | 10 2007 008 381 A1 | 8/2008 |
| JP | 2005-9998 A | 1/2005 |
| WO | 93/25877 A1 | 12/1993 |
| WO | 2007/147663 A1 | 12/2007 |

* cited by examiner

INFRARED SENSOR DEVICE AND METHOD FOR PRODUCING AN INFRARED SENSOR DEVICE

This application is a 35 U.S.C. §371 National Stage Application of PCT/EP2013/057693, filed on Apr. 12, 2013, which claims the benefit of priority to Serial No. DE 10 2012 208 192.5, filed on May 16, 2012 in Germany, the disclosures of which are incorporated herein by reference in their entirety.

BACKGROUND

The disclosure relates to an infrared sensor device and a method for producing an infrared sensor device.

Pixel structures produced by surface micromachining are known in the prior art. By way of example, WO 9325877 discloses thin metal lines embedded in passivation layers composed of $SiO_2$ or $Si_xN_x$ with a bolometer film resistor likewise embedded in passivation layers, which are connected in an arrangement which together with a reflection layer at a suitable distance forms a $\lambda/4$ absorber.

WO 2007147663 discloses the production of thermally insulating cavities by bulk micromachining, above which cavities sensor elements suspended on arms that are as long and thin as possible are then produced by structuring of the Si or SOI membrane.

Furthermore, an IR sensor array based on an SOI pixel technology with all-round passivation is known. In this IR sensor array, the small suspension arms are arranged between pixel and column or row wiring. The pn junction extends as far as the surface.

SUMMARY

An object of the disclosure is to provide an improved infrared sensor device which allows more pixels to be accommodated on the same area.

The object is achieved by means of an infrared sensor device, comprising:
- a top side and an underside
- at least one sensor element formed in a semiconductor substrate, wherein a thermal insulation layer is formed in an SOI wafer around the sensor element and below the sensor element; and
- a suspension unit, by means of which the sensor element is suspended in the SOI wafer; characterized in that the sensor element is arranged substantially below the suspension unit.

In accordance with a further aspect, the present disclosure provides an infrared sensor array comprising a plurality of infrared sensor devices according to the disclosure.

In accordance with a further aspect, the disclosure provides a method for producing an infrared sensor device, comprising the following steps:
- providing an (SOI) wafer;
- forming gaps in the (SOI) wafer for defining semiconductor substrate islands;
- filling the gaps with oxide material;
- doping the semiconductor substrate islands;
- producing sacrificial layer etching holes to sacrificial regions and between the semiconductor substrate islands through an entire layer construction of the SOI wafer as far as a carrier substrate;
- sacrificial layer etching of the semiconductor substrate islands and the sacrificial regions for freeing a sensor element.

The arrangement of the sensor element below the suspension unit advantageously provides an infrared sensor device having pixels which have a higher area filling factor. In the context of this application, the expression "below" the suspension unit is taken to mean the side which, in relation to the suspension unit, faces the underside of the infrared sensor device. As a result, a pixel density can be increased when the infrared sensor device is used in a thermographic camera.

The respective dependent claims relate to preferred developments.

One preferred embodiment of the infrared sensor device is characterized in that the sensor element is a diode. A sensor element having a property that changes its value in a temperature-dependent manner is advantageously provided as a result. The disclosure thus makes use of the temperature change brought about by the infrared radiation in order to evaluate a voltage drop across the diode that is altered by the temperature change.

One preferred embodiment of the infrared sensor device according to the disclosure is characterized in that the semiconductor substrate of the sensor element has monocrystalline, substantially U-shaped silicon regions, wherein doping zones of the silicon regions are arranged substantially vertically. By virtue of the vertical arrangement of the doping zones, the temperature-sensitive region of the sensor element is shifted into the depth, as a result of which the lower defect density is used arises in the space charge zone of the pn junction of the diode. Advantageously lower surface leakage currents flow as a result. The area dimensions of the sensor element can moreover be advantageously reduced as a result, thus resulting in a compact design of the sensor element.

One preferred embodiment of the infrared sensor device according to the invention is characterized in that the doping zones are separated laterally from one another by oxide material. An additional absorber volume for the IR radiation to be detected is advantageously available as a result.

One advantageous development of the infrared sensor device provides that, by means of the suspension unit, the sensor element is connected to the rest of the (SOI) wafer in two regions. In the case of use in a sensor array this gives rise firstly to a low thermal coupling of the individual sensor elements among one another and toward the substrate.

One preferred embodiment of the infrared sensor device according to the disclosure is characterized in that the suspension unit is formed symmetrically in a vertical direction, wherein an electrical conductor track is arranged in the suspension unit substantially centrally between two layers of oxide material having substantially identical thicknesses. This advantageously results in a stress-symmetrical construction of the suspension structure, which supports a reduced basic deflection after the suspension unit has been etched free and a response of the deflection with temperature.

One preferred embodiment of the infrared sensor device according to the disclosure is characterized in that the conductor track starts substantially in the center of the sensor element and is formed substantially spirally above the sensor element, i.e. in relation to the sensor element on the side facing the top side of the infrared sensor device. In this way, it is possible to realize small suspension arms that are very long without crossings. This advantageously gives rise to a low heat dissipation, which advantageously brings about a low thermal coupling of the sensor element to the substrate.

One preferred embodiment of the infrared sensor device according to the disclosure provides that a material of the electrical conductor tracks is at least one from the group: Ti, TiN, Ta, TaN or a combination of said materials. An expedient compromise between electrical conductivity and heat conduction is made with these materials or combinations thereof, as a result of which the sensor element is advantageously coupled only slightly to the substrate.

One preferred embodiment of the infrared sensor device according to the disclosure is characterized in that an optical thickness of layers of the oxide material that are arranged on the sensor element substantially corresponds to an odd multiple of one quarter of a wavelength to be detected. This constitutes an expedient dimensioning of the oxide layer for the absorption of the wavelength to be detected.

One preferred embodiment of the infrared sensor device according to the disclosure is characterized in that a thickness of the layers of the oxide material above the sensor element is greater than in the region of the suspension unit. In the context of this application, the expression "above" the sensor element is taken to mean the side which, in relation to the sensor element, faces the top side of the infrared sensor device. As a result, advantageously, an increased absorber layer thickness is provided only in the region of the sensor element, but not in the region of the suspension structure. This can advantageously bring about an increase in the signal-to-noise ratio.

One advantageous development of the infrared sensor device according to the disclosure is distinguished by the fact that a reflector layer is arranged on a surface of the sensor element. An absorption path and thus an absorption of the radiation to be detected are advantageously increased in this way.

Further features and advantages of the present disclosure are explained below on the basis of embodiments with reference to the figures. In this case, all described or illustrated features per se or in any combination form the subject matter of the disclosure, independently of their summary in the patent claims or the back-reference thereof, and independently of the wording or illustration in the description or in the figures. The figures are primarily intended to elucidate the principles essential to the disclosure and are not necessarily true to scale. In the figures, identical reference signs designate identical or functionally identical elements.

BRIEF DESCRIPTION OF THE DRAWINGS

In the figures:

FIG. 2a to FIG. 3f show method sections of a method for producing one embodiment of the infrared sensor device according to the disclosure with corresponding intermediate products.

DETAILED DESCRIPTION

Figure 1A:
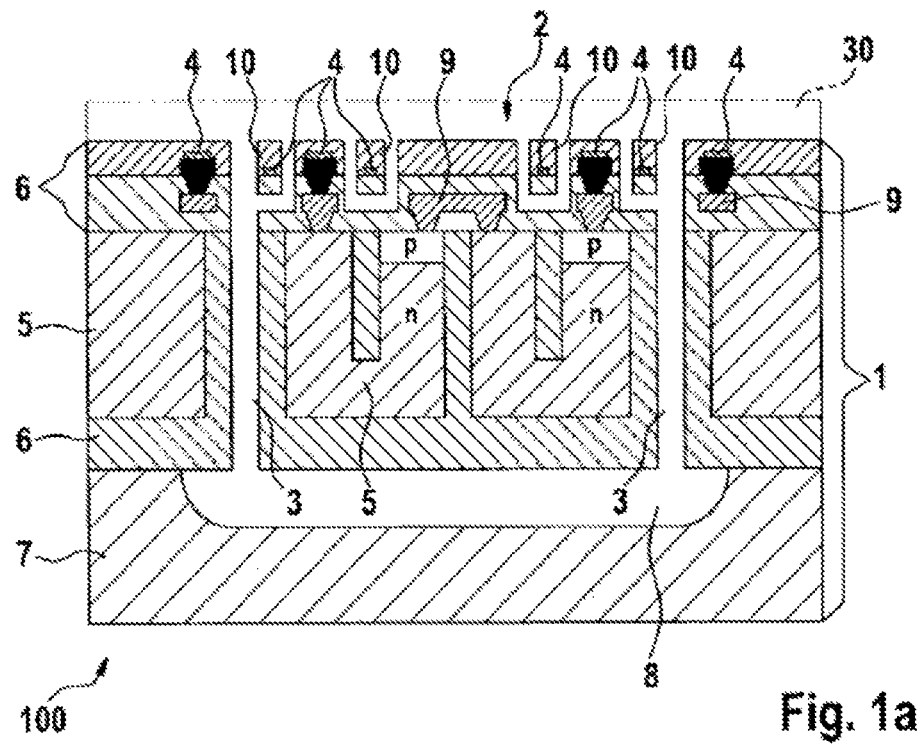
FIG. 1a shows a cross-sectional view through one embodiment of the infrared sensor device according to the disclosure.

FIG. 1a shows a basic cross-sectional view of one embodiment of the infrared sensor device 100 according to the disclosure. A basic material of the infrared sensor device 100 comprises an SOI wafer 1 (silicon-on-insulator), which comprises a carrier substrate 7 (handle wafer), an oxide material 6 and a component layer with a semiconductor substrate 5. A plurality of layers of oxide material 6 are applied on a surface of the SOI wafer 1 which is arranged at a top side 11 of the infrared sensor device 100, said layers constituting a metallization plane with conductor tracks 4 for the electrical supply of a sensor element 2.

The sensor element 2 is embodied as a semiconductor diode, wherein monocrystalline silicon is preferably used as the basic material of the diode, said monocrystalline silicon advantageously having a significantly improved noise behavior (e.g. as a result of the grain boundary noise being eliminated, in comparison with polycrystalline silicon. The sensor element 2 within the (SOI) wafer 1, which is arranged at an underside 12 of the infrared sensor device 12 of the infrared sensor device 100, is thermally insulated from the rest of the substrate by thermal insulation trenches in the form of a circumferential gap 3 and a cavity 8. The structure of the diode is substantially oriented vertically, wherein the diode has doped semiconductor substrate zones embodied substantially in a U-shaped fashion. This advantageously brings about reduced surface leakage currents as a result of the pn junction being displaced into the depth and a lower defect density in the space charge zone. As a result of the substantially U-shaped basic structure of the diode, moreover, a packing density of the diodes is advantageously increased, which can bring about a higher pixel density in use in a sensor array.

A suspension unit 10 for the sensor element 2 is formed by layers of oxide material 6 which are freed all around and in which conductor tracks 4 are arranged. In vertical orientation, the suspension unit 10 is constructed substantially symmetrically, wherein a thickness of the oxide material 6 in the region of the suspension unit 10 is smaller than in the region of the rest of the sensor element 2. As a result, a thermal conductivity of the suspension unit 10 can be kept advantageously low by virtue of a small cross-sectional area. As a result, this makes it possible to achieve an improved signal-to-noise ratio (SNR) of the infrared sensor device 100 by virtue of an increased absorber layer thickness in the pixel region, which is not present in the region of the suspension unit 10. A highly sensitive infrared sensor device 100 can advantageously be provided as a result.

Oxide material 6 is likewise arranged laterally around the doping zones of the diode, which advantageously brings about an increased absorber layer thickness, and provides a defined demarcation of the individual diode elements among one another. Moreover, as a result, a lateral outdiffusion of the doping zones of the diode need not be taken into consideration, which advantageously permits a higher integration density for the sensor element 2.

An optical thickness of the oxide layers on the sensor element 2 substantially corresponds to an odd multiple of one quarter of the wavelength $\lambda$ to be detected, which has proved to be particularly expedient for the absorption of electromagnetic radiation. Moreover, the symmetrical construction of the suspension unit 10 supports a reduced basic deflection after the suspension unit 10 has been etched free and a low temperature dependence of the deflection.

A conductor track 4 preferably comprises a monolayer or multilayers of a combination of the following materials: T, TiN, Ta, TaN. These materials all advantageously have an expedient compromise between electrical conductivity and heat conduction, such that unnecessary heating of the sensor element 2 is avoided as a result of the use of the materials mentioned. A conductor track 4 preferably has a cross section of less than approximately 0.1 $\mu m^2$.

A polycrystalline silicon 9 can advantageously be used for the conductor tracks 4 and as sacrificial layer material during the production of the infrared sensor device 100.

Optionally, a reflector layer 30 is arranged on a surface at the top side 11 of the infrared sensor device 100, which reflector layer increases an absorption of the radiation to be detected and advantageously increases an efficiency of the infrared sensor device 100 as a result.

Figure 1B:
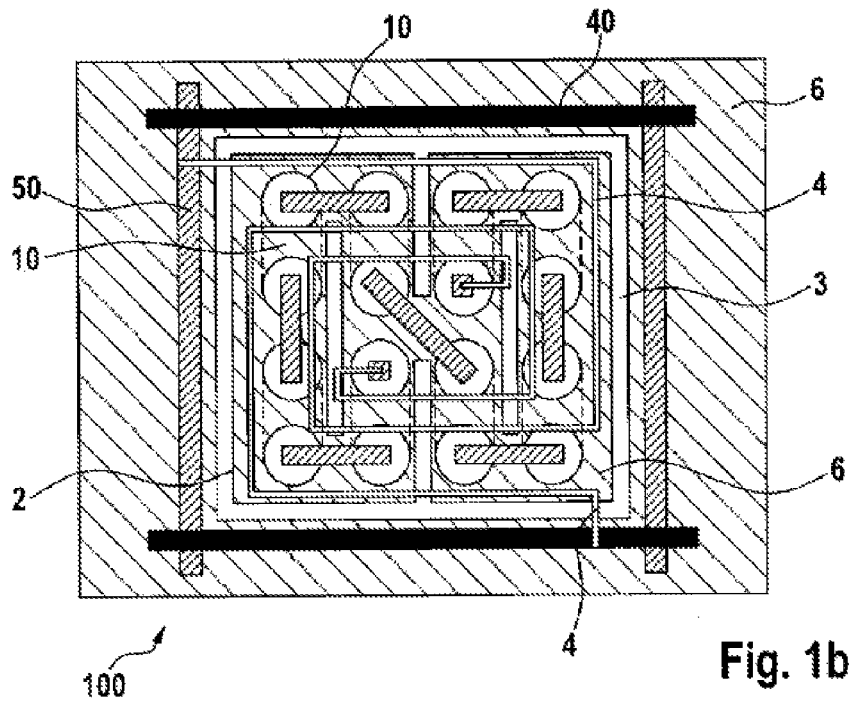
FIG. 1b shows a plan view of another embodiment of the infrared sensor device according to the disclosure.

FIG. 1b shows a basic plan view of one embodiment of an infrared sensor device 100 according to the disclosure. The gap 3 extending completely circumferentially around the sensor element 2 can be discerned, said gap thermally insulating the sensor element 2 from the rest of the substrate. Moreover, the gap 3 serves as a sacrificial layer etching hole in a process for producing the infrared sensor device 100. The sensor element 2 has a total of eight diodes, for example, a minimum number of the diodes for the sensor element 2 being one. The diodes are electrically connected in series and/or in parallel, wherein a respective diode element is integrated into the silicon of the semiconductor substrate 5 in such a way that the doping zones are delimited laterally by oxide trenches. It can furthermore be discerned that the diodes of the sensor element 2 are arranged substantially below the suspension unit 10. As a result, an area filling factor of the sensor element 2 can be advantageously increased, as a result of which a greater number of sensor elements 2 can be arranged on a defined area.

Conductor tracks 4 start substantially in the center of the sensor element 2 and are formed substantially spirally above the sensor element 2. In this case, the gap 3 is bridged only in two regions in order to provide an electrically conductive connection between the sensor element 2 and a row line 40 and respectively a column line 50 of the infrared sensor device 100. The small arms of the suspension unit 10 with the conductor tracks 4, in comparison with conventional constructions, are formed substantially completely above the sensor element 2, i.e. side facing the top side 11, rather than for instance alongside those in the prior art, which advantageously brings about an area saving and thus a higher area filling factor. An anchoring (not illustrated) of the suspension unit 10 with the conductor tracks 4 is effected on the SOI wafer 1 at engagement points of suitable anchor structures. Examples of these structures are supporting pillars or walls (not illustrated) between the individual sensor elements 2, wherein the structures of the supporting pillars are formed from semiconductor substrate material.

By way of example, aluminum with a silicon-copper doping (Al—Si—Cu) is chosen for a metallization of the row lined 40 and respectively of the column line 50. The material mentioned can also be used for a metallization within the sensor element 2. The conductor tracks 4 in the arms of the support unit 10 are embodied as long and narrow in relation to their cross section, which advantageously brings about a low thermal coupling between the sensor element 2 and the semiconductor substrate 5. Thermal bridges between the individual sensor elements 2 and to the substrate 7 are advantageously made as small as possible as a result.

Figure 2A:
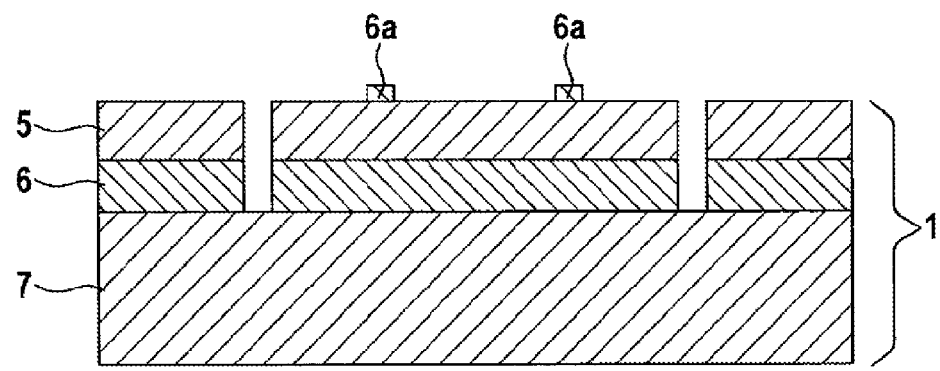

FIG. 2a shows an intermediate product of a first step for producing the infrared sensor device according to the disclosure. In this case, a (SOI) wafer 1 is provided, comprising the individual layers of carrier substrate 7, oxide material 6 (preferably embodied as BOX, buried oxide) and a layer comprising semiconductor substrate 5. The semiconductor substrate 5 is preferably embodied as a monocrystalline silicon, thereby advantageously avoiding grain boundary noise within the semiconductor substrate 5. Two islands comprising stop oxide 6a are applied for the purpose of a trench etching stop. Furthermore, trenches are etched into the SOI wafer 1 from above in order to structure the (SOI) wafer 1 as far as the underside of the buried oxide layer.

Figure 2B:
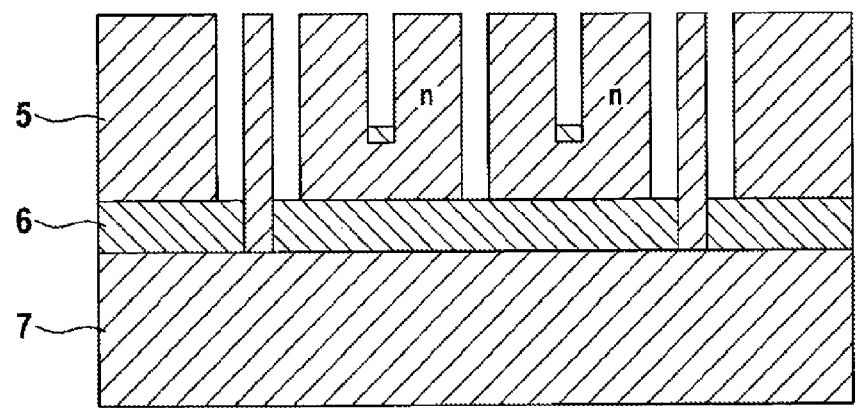

FIG. 2b shows an intermediate product of a next epitaxy step, in which a material of the semiconductor substrate 5 is grown onto the structure from FIG. 2a. Both the epitaxial layer and the material already present beforehand are advantageously already doped in this case. Furthermore, trenches are etched in order to provide a basic geometrical structure of the sensor device 100 according to the disclosure. It is evident that the basic structure of the sensor element 2 within the semiconductor substrate 5 is embodied in a substantially U-shaped fashion.

Figure 2C:
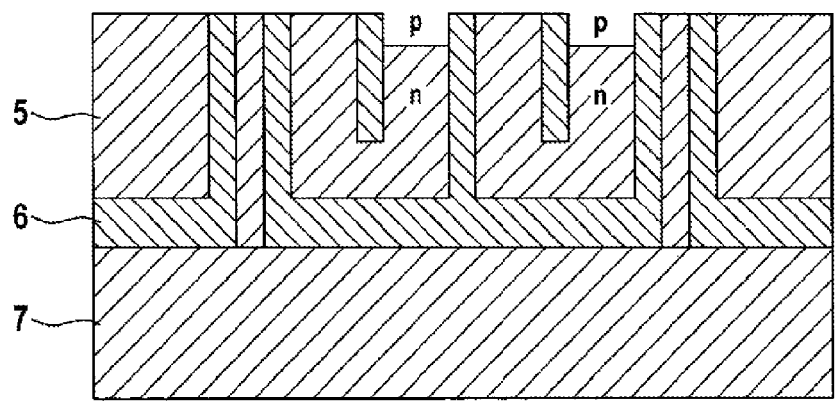

FIG. 2c shows a further intermediate product of a next step, in which oxide material 6 is filled into the existing trenches. The oxide material 6 filled into the trenches advantageously acts as additional absorber volume for the radiation to be detected. Furthermore, this step involves carrying out a p-doping in partial regions of the semiconductor substrate 5.

Figure 2D:
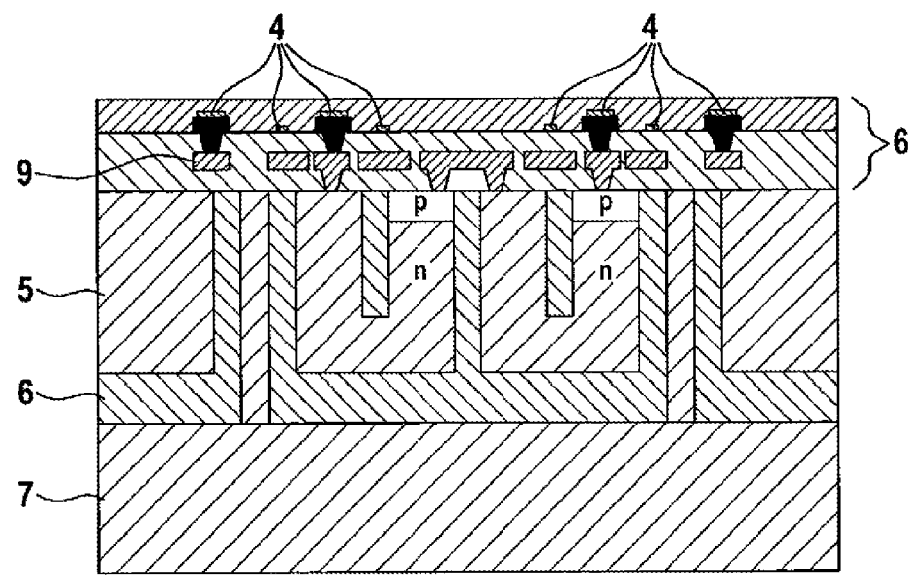

FIG. 2d shows, in principle, that in a next step a plurality of layers of oxide material 6 are applied to the structure obtained from FIG. 2c. In this case, at least two wiring planes are deposited and structured within the layers. Conductor tracks 4 are obtained in this way, which conductor tracks can preferably comprise three different materials. They comprise one or a plurality from the materials: Ti, TiN, Ta, TaN or a combination of these materials. Furthermore (illustrated in black), the materials comprise e.g. aluminum with a silicon-copper doping, this material being used in particular for the row line 40 and column line 50. Finally, the materials can comprise polycrystalline silicon 9.

Figure 2E:
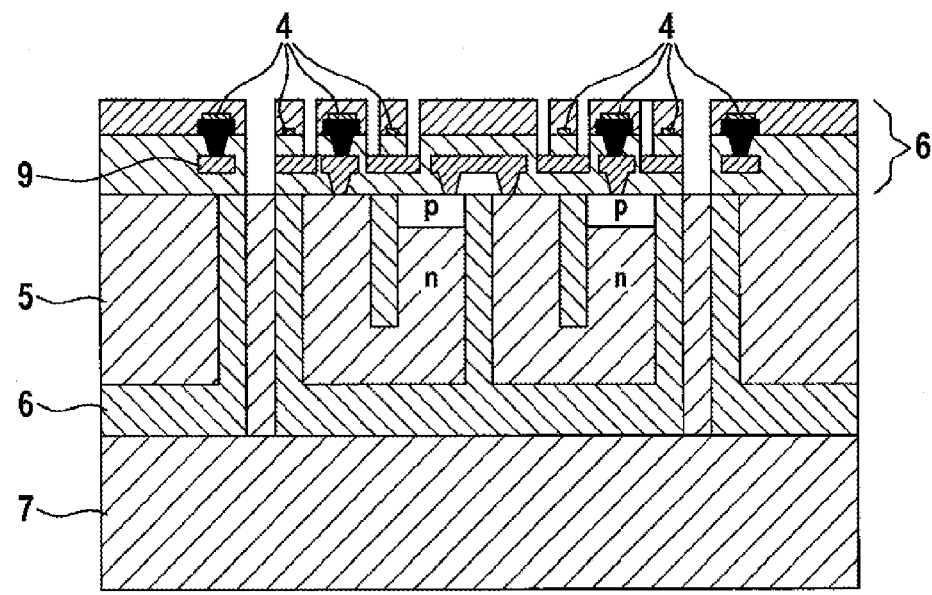

FIG. 2e shows an intermediate product of a next step, in which sacrificial layer etching holes were introduced into the structure from FIG. 2d.

Figure 2F:
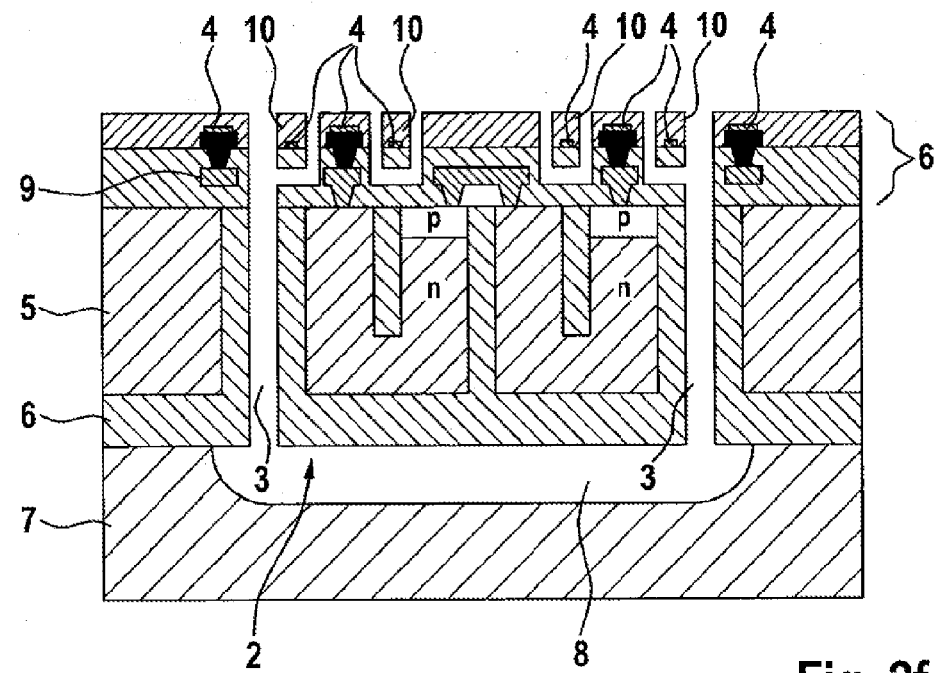

FIG. 2f shows a result of a last step of the method for producing the infrared sensor device 100 according to the disclosure. In this case, sacrificial layer etching is carried out, as a result of which a spatially substantially freed sensor element 2 is formed which is thermally insulated from the surrounding substrate by a gap 3 and a cavity 8 arranged below the sensor element 2. Furthermore, the layers of oxide material 6 are undercut in order thereby to form or expose the suspension unit 10 for the sensor element 2. This advantageously results in a low thermal coupling between the sensor element 2 and the surrounding substrate.

As an additional final step (not illustrated in the figures), during the manufacture of a sensor array comprising image pixels, wafer level capping of the array wafer with a suitable cap wafer is also carried out for the production of a sufficiently good vacuum for thermal insulation and for the protection of the sensing diode elements.

To summarize the disclosure provides an improved infrared sensor device which is suitable for a use in a sensor array, e.g. for a use in thermographic cameras. The disclosure can be used in all applications in which thermal radiation is intended to be detected in a spatially resolved manner and in which unit costs are of greater importance than high-precision temperature measurement. Examples thereof include motor vehicle night vision devices and thermography, for example for building insulation or process monitoring. Furthermore the disclosure can be used to realize thermographic cameras for domestic use (e.g. for localizing insulation leaks or heat leaks). Moreover, the infrared sensor device according to the disclosure can be used as an individual pixel for temperature monitoring with detection of the inherent thermal radiation of a variety of objects, devices or living beings.

An image pixel element realized with the infrared sensor device according to the disclosure advantageously has a low thermal coupling to the substrate as a result of a small cross section of the suspension unit, as a result of a long length of arms of the suspension unit, as a result of the absence of thermal bridges and as a result of a thick absorber layer and/or reflector layer.

As a result of the presence of the layers of oxide material in lateral extension around the diode, it is not necessary to take account of lateral outdiffusion of the implantations, as a result of which the lateral dimensions of the diode are advantageously defined lithographically. This advantageously allows a denser design on a smaller area.

Furthermore, the pn junction of the diode is at a distance from the surface of the sensor element, which means moved away from implantation damage of the doping processes of the semiconductor substrate 5 into the depth. The resultant lower defect density in the space charge zone advantageously leads to reduced leakage currents and an improved signal-to-noise ratio (SNR).

As a result, the disclosure provides an infrared sensor device having highly sensitive image pixels, a low heat capacity, a low thermal coupling to the substrate and thus a high image refresh frequency. In comparison with conventional infrared sensor devices, with the same signal-to-noise ratio the infrared sensor device according to the disclosure can be produced in a smaller fashion and thus more cost-effectively.

Although the present disclosure has been described on the basis of preferred exemplary embodiments, it is not restricted thereto. In particular, the materials and topologies mentioned are merely by way of example and are not restricted to the examples explained. The person skilled in the art will therefore be able to modify the described features of the disclosure or combine them with one another, without departing from the essence of the disclosure.

The invention claimed is:

1. An infrared sensor device, comprising:
   at least one sensor element formed in a semiconductor substrate, the at least one sensor element substantially U-shaped and including:
      two vertically extending portions separated by a vertically extending portion of oxide material; and
      a horizontally extending portion at a lower end of the at least one sensor element that connects the two vertically extending portions;
   a gap outwardly of the at least one sensor element and encircling the at least one sensor element;
   a cavity beneath the sensor element and in fluid communication with the gap such that the gap and the cavity thermally insulate the at least one sensor element; and
   a suspension unit configured to suspend the at least one sensor element above the cavity, the at least one sensor element arranged substantially below the suspension unit.

2. The infrared sensor device as claimed in claim 1, wherein the sensor element is configured as a diode.

3. The infrared sensor device as claimed in claim 2, wherein:
   the at least one sensor element is monocrystalline, and
   a vertical extent of the two vertically extending portions is greater than a horizontal extent of the horizontally extending portion such that the at least one sensor element is arranged substantially vertically.

4. The infrared sensor device as claimed in claim 3, wherein the at least one sensor element is surrounded by oxide material.

5. The infrared sensor device as claimed in claim 1, wherein the suspension unit is configured to connect the at least one sensor element to the rest of the wafer in two regions.

6. The infrared sensor device as claimed in claim 1, wherein the suspension unit is formed symmetrically in the vertical direction, wherein an electrical conductor track is arranged in the suspension unit substantially centrally between two layers of oxide material having substantially identical thicknesses, and wherein the electrical conductor track is narrower than the suspension unit.

7. The infrared sensor device as claimed in claim 6, wherein the conductor track starts substantially in the center of the at least one sensor element and is formed substantially spirally above the at least one sensor element.

8. The infrared sensor device as claimed in claim 6, wherein a material of the electrical conductor track is at least one from the group: Ti, TiN, Ta, TaN or a combination of Ti, TiN, Ta, and TaN.

9. The infrared sensor device as claimed in claim 1, wherein an optical thickness of layers of oxide material that are arranged on the at least one sensor element substantially corresponds to an odd multiple of one quarter of a wavelength to be detected.

10. The infrared sensor device as claimed in claim 9, wherein a thickness of the layers of the oxide material above the at least one sensor element is greater than a thickness of the layers of the oxide material in the region of the suspension unit.

11. The infrared sensor device as claimed in claim 1, wherein a reflector layer is arranged on a surface of the at least one sensor element.

12. An infrared sensor array, comprising:
   a plurality of sensor elements formed in a semiconductor substrate, each sensor element substantially U-shaped and including:
      two vertically extending portions separated by a vertically extending portion of oxide material; and
      a horizontally extending portion at a lower end of the at least one sensor element that connects the two vertically extending portions;
   a gap outwardly of the plurality of sensor elements and encircling the plurality of sensor elements;
   a cavity beneath the plurality of sensor elements and in fluid communication with the gap such that the gap and the cavity thermally insulate the plurality of sensor elements; and
   a suspension unit configured to suspend the plurality of sensor elements in the above the cavity, the plurality of sensor elements arranged substantially below the suspension unit.

13. The infrared sensor array as claimed in claim 12, wherein at least row or column lines of the sensor array comprise polycrystalline silicon.

14. The infrared sensor device as claimed in claim 1, wherein the semiconductor substrate is configured as an SOI wafer.

15. The infrared sensor array of claim 12, further comprising:
   oxide material surrounding each sensor element such that each sensor element is laterally separated from each other and is also separated from the gap and the cavity.

16. The infrared sensor device as claimed in claim 1, wherein:
   one of the two vertically extending portions of the sensor element has a p-doped region above an n-doped region that is connected to the horizontally extending portion; and
   an other of the two vertically extending portions and the horizontally extending portion are n-doped.

* * * * *